(12) United States Patent
Andrews et al.

(10) Patent No.: US 7,244,965 B2
(45) Date of Patent: Jul. 17, 2007

(54) POWER SURFACE MOUNT LIGHT EMITTING DIE PACKAGE

(75) Inventors: Peter S. Andrews, Durham, NC (US); Ban P. Loh, Durham, NC (US)

(73) Assignee: Cree Inc,, Durham, NC (US)

( * ) Notice: Subject to any disclaimer, the term of this patent is extended or adjusted under 35 U.S.C. 154(b) by 0 days.

(21) Appl. No.: 10/692,351

(22) Filed: Oct. 22, 2003

(65) Prior Publication Data
US 2004/0079957 A1 Apr. 29, 2004

Related U.S. Application Data

(63) Continuation-in-part of application No. 10/446,532, filed on May 27, 2003.

(60) Provisional application No. 60/408,254, filed on Sep. 4, 2002.

(51) Int. Cl.
*H01L 33/00* (2006.01)

(52) U.S. Cl. .......................... 257/98; 257/99; 257/100; 257/95; 257/699; 257/706; 257/707; 257/712; 257/E33.056

(58) Field of Classification Search .................. 257/95, 257/98, 99, 100, 699, 706, 707, 712, E33.056
See application file for complete search history.

(56) References Cited

U.S. PATENT DOCUMENTS

| | | | | |
|---|---|---|---|---|
| 3,443,140 | A | * | 5/1969 | Jensen et al. ................ 313/499 |
| 3,760,237 | A | * | 9/1973 | Jaffe ............................ 257/98 |
| 3,875,456 | A | * | 4/1975 | Kano et al. .................. 313/501 |
| 4,168,102 | A | * | 9/1979 | Chida et al. ................. 313/111 |
| 4,267,559 | A | | 5/1981 | Johnson et al. |

(Continued)

FOREIGN PATENT DOCUMENTS

EP 1 059 678 12/2000

(Continued)

OTHER PUBLICATIONS

U.S. Appl. No. 10/446,532, Entitled: Power surface mount light emitting die package, Inventor(s): Ban P. Loh, filing date: May 27, 2003, Published date: Mar. 4, 2004.

(Continued)

*Primary Examiner*—Eugene Lee
(74) *Attorney, Agent, or Firm*—Harness, Dickey & Pierce, P.L.C.

(57) ABSTRACT

A light emitting die package is disclosed. The die package includes a substrate, a reflector plate, and a lens. The substrate may be made from thermally conductive but electrically insulating material or from a material that is both thermally and electrically conductive. In embodiments wherein the substrate is made from an electrically conductive material, the substrate further includes an electrically insulating, thermally conductive material formed on the electrically conductive material. The substrate has traces for connecting to a light emitting diode (LED) at a mounting pad. The reflector plate is coupled to the substrate and substantially surrounds the mounting pad. The lens substantially covers the mounting pad. Heat generated by the LED during operation is drawn away from the LED by both the substrate (acting as a bottom heat sink) and the reflector plate (acting as a top heat sink). The reflector plate includes a reflective surface to direct light from the LED in a desired direction.

23 Claims, 9 Drawing Sheets

U.S. PATENT DOCUMENTS

| | | | | |
|---|---|---|---|---|
| 4,603,496 | A | * | 8/1986 | Latz et al. .................... 40/547 |
| 5,173,839 | A | | 12/1992 | Metz, Jr. |
| 5,785,418 | A | | 7/1998 | Hochstein |
| 5,789,772 | A | | 8/1998 | Jiang |
| 5,841,177 | A | | 11/1998 | Komoto et al. |
| 5,847,507 | A | * | 12/1998 | Butterworth et al. ....... 313/512 |
| 5,857,767 | A | * | 1/1999 | Hochstein .................. 362/294 |
| 5,869,883 | A | | 2/1999 | Mehringer et al. |
| 5,907,151 | A | * | 5/1999 | Gramann et al. ........ 250/214.1 |
| 5,959,316 | A | | 9/1999 | Lowery |
| 5,998,925 | A | | 12/1999 | Shimizu et al. |
| 6,124,635 | A | * | 9/2000 | Kuwabara .................... 257/703 |
| 6,180,962 | B1 | * | 1/2001 | Ishinaga ..................... 257/99 |
| 6,238,599 | B1 | | 5/2001 | Gelorme et al. |
| 6,274,924 | B1 | * | 8/2001 | Carey et al. ................ 257/676 |
| 6,281,435 | B1 | * | 8/2001 | Maekawa .................. 174/52.2 |
| 6,307,272 | B1 | | 10/2001 | Takahashi et al. |
| 6,329,706 | B1 | | 12/2001 | Nam |
| 6,335,548 | B1 | | 1/2002 | Roberts et al. |
| 6,362,964 | B1 | * | 3/2002 | Dubhashi et al. ........... 361/707 |
| RE37,707 | E | | 5/2002 | Bozzini et al. |
| 6,429,513 | B1 | | 8/2002 | Shermer, IV et al. |
| 6,444,498 | B1 | | 9/2002 | Huang et al. |
| 6,456,766 | B1 | | 9/2002 | Shaw et al. |
| 6,457,645 | B1 | | 10/2002 | Gardner, Jr. |
| 6,468,821 | B2 | | 10/2002 | Maeda et al. |
| 6,469,322 | B1 | * | 10/2002 | Srivastava et al. ............ 257/89 |
| D465,207 | S | | 11/2002 | Williams et al. |
| 6,480,389 | B1 | | 11/2002 | Shie |
| 6,492,725 | B1 | | 12/2002 | Loh et al. |
| 6,501,103 | B1 | * | 12/2002 | Jory et al. .................. 257/100 |
| 6,525,386 | B1 | * | 2/2003 | Mills et al. ................. 257/433 |
| 6,531,328 | B1 | | 3/2003 | Chen |
| 6,541,800 | B2 | * | 4/2003 | Barnett et al. ................ 257/98 |
| 6,559,525 | B2 | | 5/2003 | Huang |
| 6,614,103 | B1 | * | 9/2003 | Durocher et al. ........... 257/678 |
| 6,680,491 | B2 | | 1/2004 | Nakanishi et al. |
| 6,707,069 | B2 | | 3/2004 | Song et al. |
| 6,710,544 | B2 | * | 3/2004 | Schliep et al. .............. 313/512 |
| 6,759,803 | B2 | * | 7/2004 | Sorg .......................... 313/512 |
| 6,791,259 | B1 | * | 9/2004 | Stokes et al. ............... 313/503 |
| 2003/0057573 | A1 | | 3/2003 | Sekine et al. |
| 2003/0168670 | A1 | | 9/2003 | Roberts et al. |
| 2003/0168720 | A1 | | 9/2003 | Kamada |
| 2003/0193080 | A1 | | 10/2003 | Cabahug et al. |
| 2003/0193083 | A1 | | 10/2003 | Isoda |
| 2004/0079957 | A1 | | 4/2004 | Andrews et al. |
| 2004/0173804 | A1 | | 9/2004 | Yu |

FOREIGN PATENT DOCUMENTS

| | | |
|---|---|---|
| JP | 2002103977 | 4/2002 |
| JP | 2003298117 | 10/2003 |

OTHER PUBLICATIONS

U.S. Appl. No. 10/721,654, Entitled: Composite leadframe LED package and method of making the same, Inventor(s): Ban P. Loh, filing date: Nov. 25, 2003, Published date: Jul. 1, 2004.

U.S. Appl. No. 10/721,641, Entitled: LED package die having a small footprint, Inventor(s): Ban P. Loh, filing date: Nov. 25, 2003, Published date: Jul. 1, 2004.

U.S. Appl. No. 10/861,929, Entitled: Power light emitting die package with reflecting lens and the method of making the same, Inventor(s): Ban P. Loh, Gerald H. Negley, filing date: Jun. 4, 2004, Published date: Not yet published.

U.S. Appl. No. 10/861,639, Entitled: Composite optical lens with an integrated reflector, Inventor(s): Ban P. Loh, Gerald H. Negley, filing date: Jun. 4, 2004, Published date: Not yet published.

International Search Report dated Feb. 27, 2007.

* cited by examiner

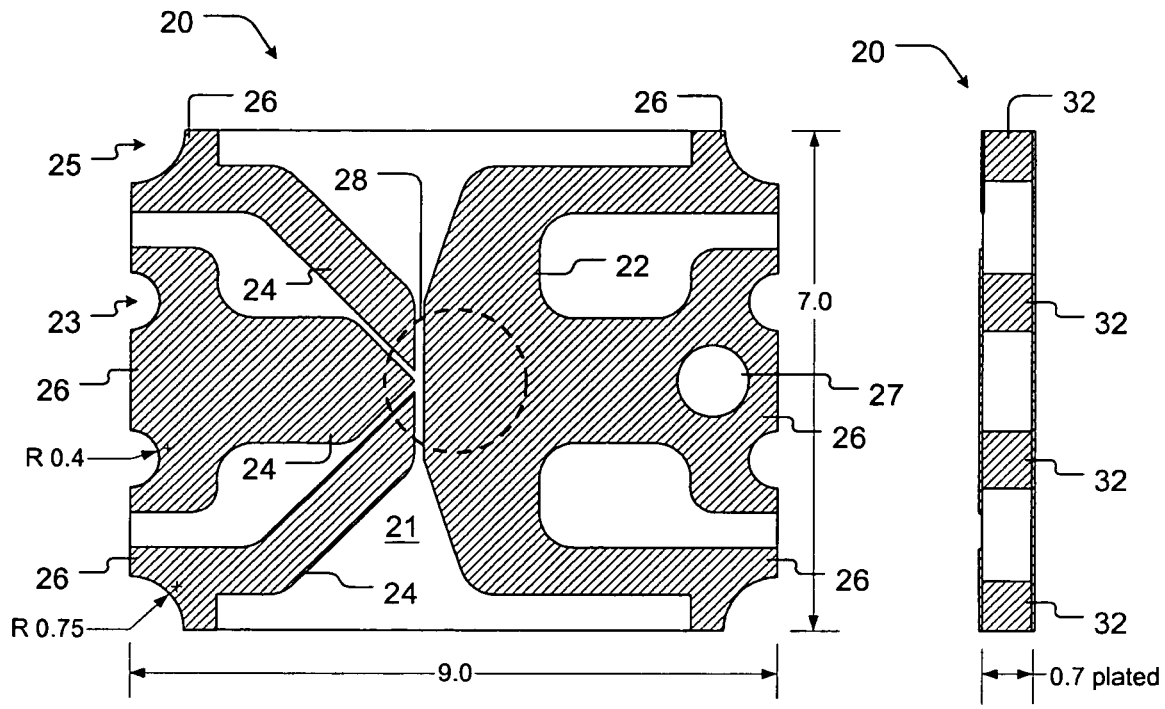
FIG. 2A
FIG. 2B
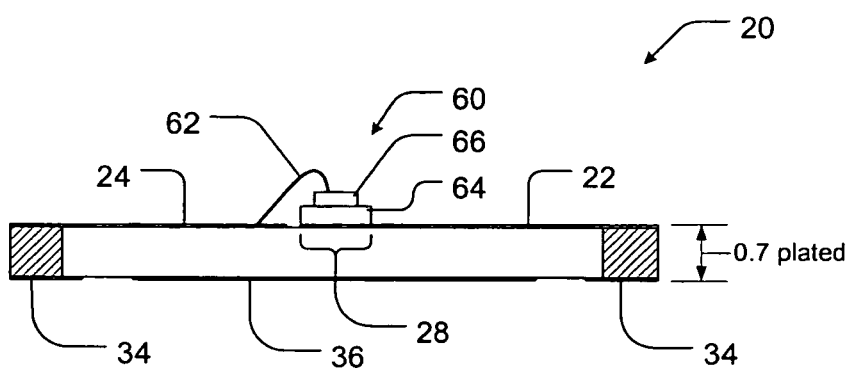
FIG. 2C

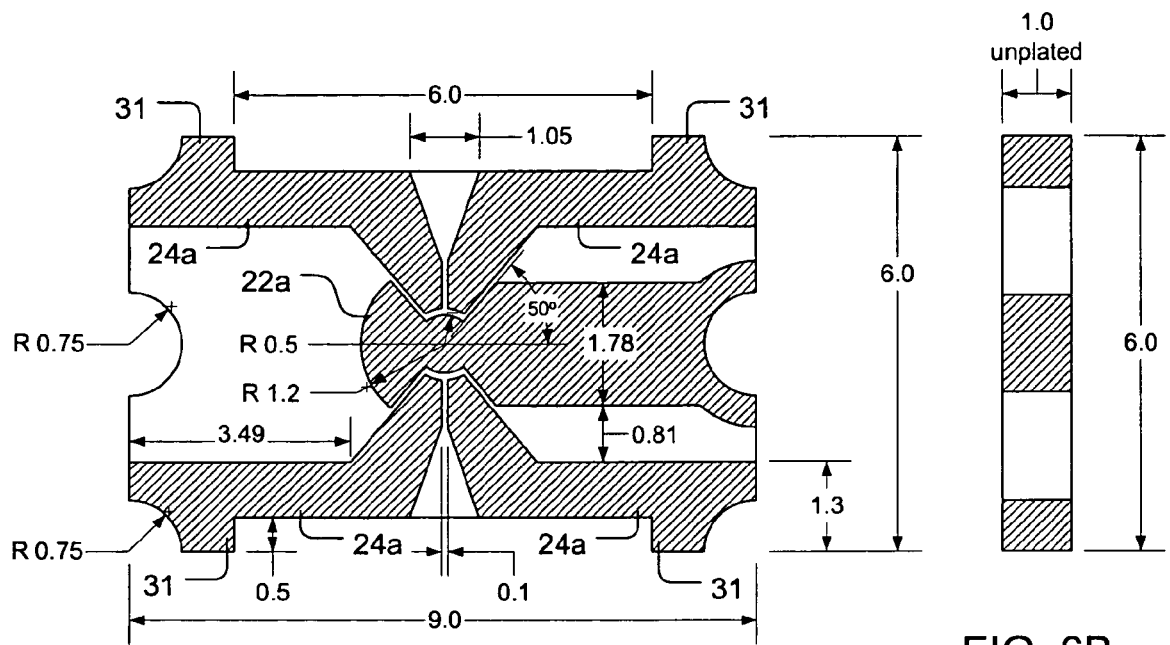
FIG. 6A
FIG. 6B
FIG. 6C
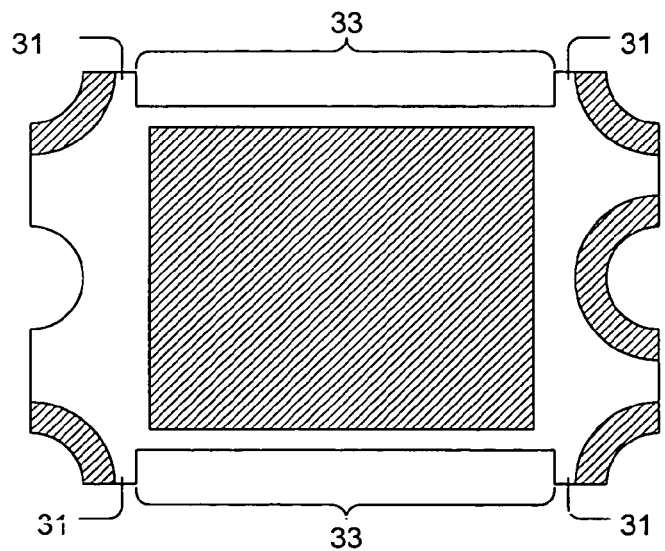
FIG. 6D

POWER SURFACE MOUNT LIGHT EMITTING DIE PACKAGE

RELATED APPLICATIONS

The present application is a continuation-in-part of U.S. patent application Ser. No. 10/446,532 entitled "Power Surface Mount Light Emitting Die Package" filed May 27, 2003, which claims the benefit of U.S. Provisional Application Ser. No. 60/408,254 entitled "Power-SMT, LED Package with Dual Heat-Sinks and an Optical System or Chemical-Coated Lens" filed Sep. 4, 2002.

BACKGROUND

The present invention relates to the field of packaging semiconductor devices, and more particularly to packaging light emitting diodes.

Light emitting diodes (LEDs) are often packaged within leadframe packages. A leadframe package typically includes a molded plastic body which encapsulates an LED, a lens portion, and thin metal leads connected to the LED and extending outside the plastic body. The metal leads of the leadframe package serve as the conduit to supply the LED with electrical power and, at the same time, may act to draw heat away from the LED. Heat is generated by the LED when power is applied to the LED to produce light. A portion of the leads extends out from the package body for connection to circuits external to the leadframe package.

Some of the heat generated by the LED is dissipated by the plastic package body; however, most of the heat is drawn away from the LED via the metal components of the package. The metal leads are typically very thin and have a small cross section. For this reason, capacity of the metal leads to remove heat from the LED is limited. This limits the amount of power that can be sent to the LED thereby limiting the amount of light that can be generated by the LED.

To increase the capacity of an LED package to dissipate heat, in one LED package design, a heat sink slug is placed under the metal leads within the LED package. The heat sink slug increases the capacity of the LED package to dissipate heat; however, the heat sink slug increases the size, the mass, and the cost of the LED package. Increases in the size, the mass, and the cost are undesirable.

In another LED package design, the leads of the leadframe are extended (in various shapes and configurations) beyond the immediate edge of the LED package body. This increases the surface area of the portions of the leads exposed to the surrounding air. The increased exposed surface area of the extended leads increases the capacity of the LED package to dissipate heat; however, the extended leads increase the size, the mass, and the cost of the LED package.

Another undesirable aspect of the current leadframe package design relates to problems associated with thermal expansion of the package. When heat is generated, the LED package experiences thermal expansion. Each of the parts of the LED package has a different coefficient of thermal expansion (CTE). For example, the CTE of the LED, the CTE of the package body, the CTE of the leads, and the CTE of lens are different from each other. For this reason, when heated, each of these parts experience different degrees of thermal expansion resulting in mechanical stresses between the parts of the package thereby adversely affecting its reliability.

Consequently, there remains a need for an improved LED package that overcomes or alleviates one or more of the shortcomings of the prior art packages.

SUMMARY

Embodiments of the present invention provide a package for a semiconductor die such as a light emitting diode, the package including a substrate having electrically conductive elements for connecting to a light emitting diode at a mounting pad, a reflector plate coupled to the substrate and substantially surrounding the mounting pad, and lens substantially covering the mounting pad.

Other embodiments of the present invention provide a semiconductor die package which includes a bottom heat sink and a top heat sink. The bottom heat sink may have traces on its top surface. A semiconductor chip may be mounted on the top surface of the bottom heat sink and electrically connected to the traces. The top heat sink may be mechanically coupled to the bottom heat sink.

In other embodiments, the bottom heat sink may include a thermally and electrically conductive plate having first and second surfaces. The plate may comprise a metal such as copper, aluminum or alloys of either. A thin, thermally conductive insulating film is formed on portions of the first surface of the metal plate and may be formed on other surfaces of the metal plate.

Conductive elements such as metal traces and/or metal leads may be formed on the ceramic/polymer film. Since the ceramic/polymer film is insulating, the conductive traces are not in electrical contact with the metal plate. The conductive element may form or be electrically connected to a mounting pad adapted to receive an electronic device such as an LED.

In some embodiments, one or more via holes may be formed through the substrate. In some embodiments, the via holes may be coated internally with an insulating material such as the ceramic/polymer film. Electrical conductors such as electrically conductive traces may be formed in the via holes to electrically connect conductive elements on the first surface of the substrate to conductive elements on the second surface of the substrate.

A substrate according to embodiments of the present invention may also include electronic circuitry such as a zener diode and/or a resistor network connected between one or more conductive elements for electro-static discharge (ESD) and/or over-voltage protection.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 2A is a top view of a portion of the semiconductor package of FIG. 1A;

FIG. 2B is a side view of a portion of the semiconductor package of FIG. 1A;

FIG. 2C is a front view of a portion of the semiconductor package of FIG. 1A;

FIG. 6A is a top view of a portion of the semiconductor package of FIG. 5;

FIG. 6B is a side view of a portion of the semiconductor package of FIG. 5;

FIG. 6C is a front view of a portion of the semiconductor package of FIG. 5;

FIG. 6D is a bottom view of a portion of the semiconductor package of FIG. 5;

DETAILED DESCRIPTION

The present invention will now be described with reference to the FIGS. 1 through 10B, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer or structure being formed on a substrate or other layer or structure. As will be appreciated by those of skill in the art, references to a layer being formed "on" another layer or substrate contemplates that additional layers may intervene. References to a layer being formed on another layer or substrate without an intervening layer are described herein as being formed "directly on" the layer or substrate. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

As shown in the figures for the purposes of illustration, embodiments of the present invention are exemplified by a light emitting die package including a bottom heat sink (substrate) having traces for connecting to a light emitting diode at a mounting pad and a top heat sink (reflector plate) substantially surrounding the mounting pad. A lens covers the mounting pad. In effect, the die package according to some embodiments of the present invention comprises a two part heat sink with the bottom heat sink utilized (in additional to its utility for drawing and dissipating heat) as the substrate on which the LED is mounted and connected, and the top heat sink utilized (in additional to its utility for drawing and dissipating heat) as a reflector plate to direct light produced by the LED. Because both the bottom and the top heat sinks draw heat away from the LED, more power can be delivered to the LED, and the LED can thereby produce more light.

Further, in the present invention, the die package itself may act as the heat sink removing heat from the LED and dissipating it. For this reason, the LED die package of the present invention may not require separate heat sink slugs or leads that extend away from the package. Accordingly, an LED die package according to the present invention may be more compact, more reliable, and less costly to manufacture than a die package of the prior art.

Figure 1A:
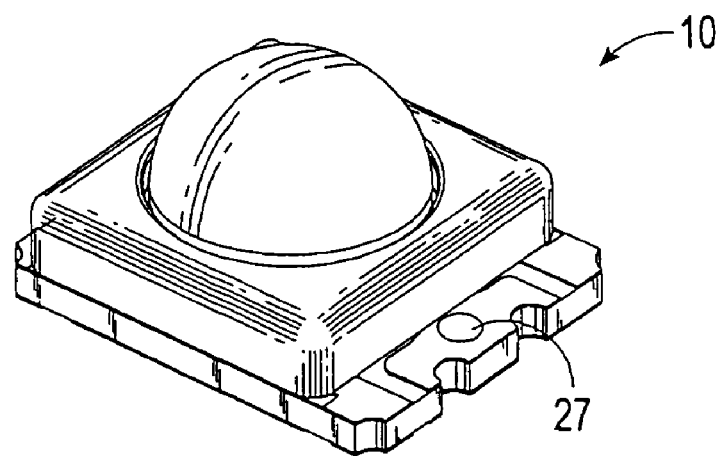
FIG. 1A is a perspective view of a semiconductor die package according to one embodiment of the present invention.
Figure 1B:
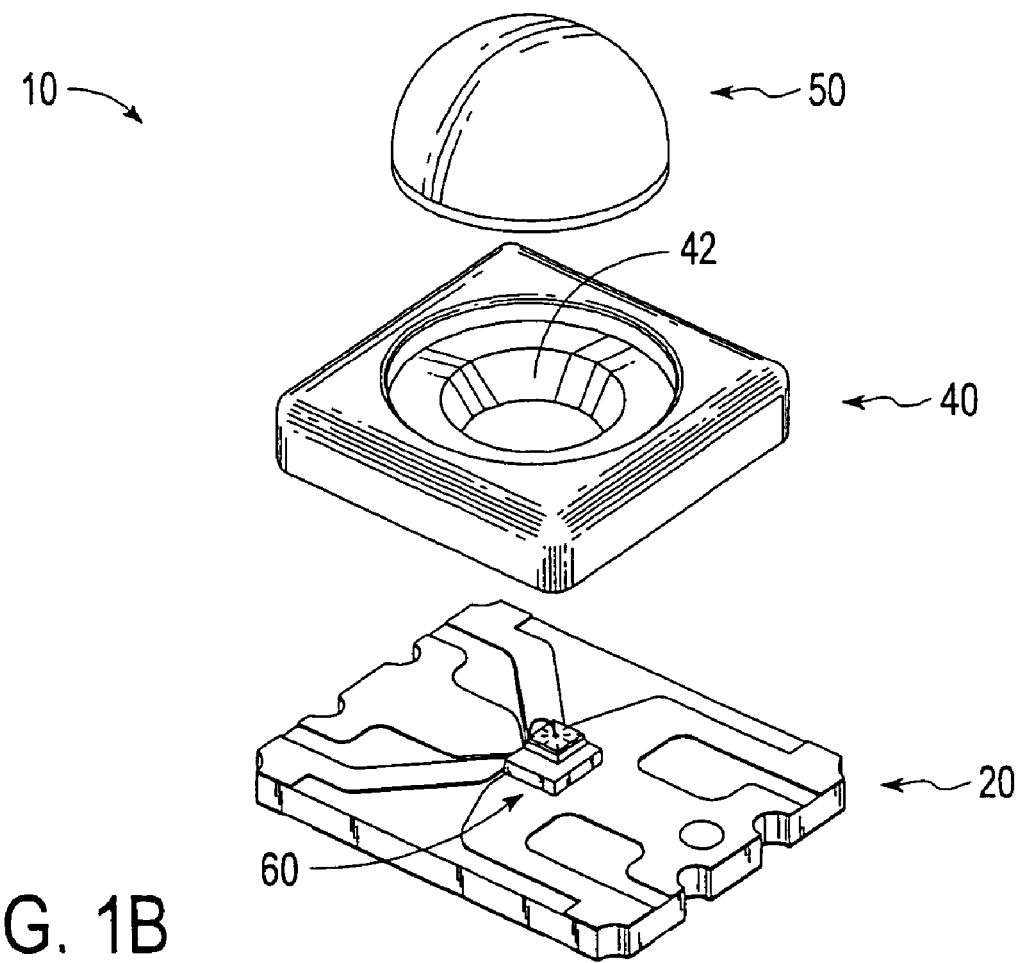
FIG. 1B is an exploded perspective view of the semiconductor package of FIG. 1A.
Figure 2D:
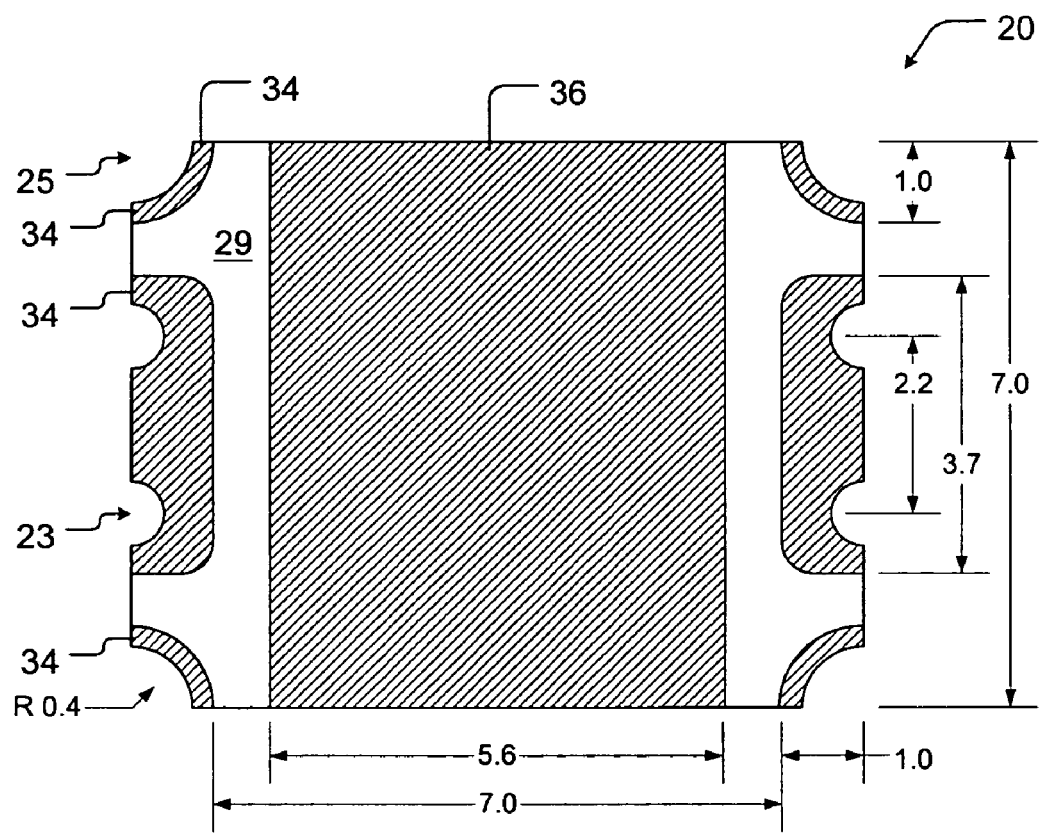
FIG. 2D is a bottom view of a portion of the semiconductor package of FIG. 1A.

FIG. 1A is a perspective view of a semiconductor die package 10 according to one embodiment of the present invention and FIG. 1B is an exploded perspective view of the semiconductor package of FIG. 1A. Referring to FIGS. 1A and 1B, the light emitting die package 10 of the present invention includes a bottom heat sink 20, a top heat sink 40, and a lens 50.

The bottom heat sink 20 is illustrated in more detail in FIGS. 2A through 2D. FIGS. 2A, 2B, 2C, and 2D provide, respectively, a top view, a side view, a front view, and a bottom view of the bottom heat sink 20 of FIG. 1A. Further, FIG. 2C also shows an LED assembly 60 in addition to the front view of the bottom heat sink 20. The LED assembly 60 is also illustrated in FIG. 1B. Referring to FIGS. 1A through 2D, the bottom heat sink 20 provides support for electrical traces 22 and 24; for solder pads 26, 32, and 34; and for the LED assembly 60. For this reason, the bottom heat sink 20 is also referred to as a substrate 20. In the Figures, to avoid clutter, only representative solder pads 26, 32, and 34 are indicated with reference numbers. The traces 22 and 24 and the solder pads 26, 32, and 34 can be fabricated using conductive material. Further, additional traces and connections can be fabricated on the top, side, or bottom of the substrate 20, or layered within the substrate 20. The traces 22 and 24, the solder pads 26, 32, and 34, and any other connections can be interconnected to each other in any combinations using known methods, for example via holes.

In some embodiments, the substrate 20 may be made of material having high thermal conductivity but is electrically insulating, for example, aluminum nitride (AlN) or alumina ($Al_2O_3$). In other embodiments, such as the embodiments described below in connection with FIGS. 7A through 10B, the substrate 20 may comprise a material that is both electrically and thermally conductive. In such embodiments, the metal leads, conductive traces 22 and 24, or both may be insulated from the substrate by means of an insulating film formed on portions of the substrate as described in more detail below. Dimensions of the substrate 20 can vary widely depending on application and processes used to manufacture the die package 10. For example, in the illustrated embodiment, the substrate 20 may have dimensions ranging from fractions of millimeters (mm) to tens of millimeters. Although the present invention is not limited to particular dimensions, one specific embodiment of the die package 10 of the present invention is illustrated in Figures having the dimensions denoted therein. All dimensions shown in the Figures are in millimeters (for lengths, widths, heights, and radii) and degrees (for angles) except as otherwise designated in the Figures, in the Specification herein, or both.

The substrate 20 has a top surface 21, the top surface 21 including the electrical traces 22 and 24. The traces 22 and 24 provide electrical connections from the solder pads (for example top solder pads 26) to a mounting pad 28. The top solder pads 26 may comprise portions of the traces 22 and 24 generally proximal to sides of the substrate 20. The top solder pads 26 are electrically connected to side solder pads 32. The mounting pad 28 is a portion of the top surface (including portions of the trace 22, the trace 24, or both) where the LED assembly 60 is mounted. Typically the mounting pad 28 is generally located proximal to center of the top surface 21. In alternative embodiments of the present invention, the LED assembly 60 can be replaced by other semiconductor circuits or chips.

The traces 22 and 24 provide electrical routes to allow the LED assembly 60 to electrically connect to the solder pads 26, 32, or 34. Accordingly, some of the traces are referred to as first traces 22 while other traces are referred to as second traces 24. In the illustrated embodiment, the mounting pad 28 includes portions of both the first traces 22 and the second traces 24. In the illustrated example, the LED assembly 60 is placed on the first trace 22 portion of the mounting pad 28 thereby making contact with the first trace 22. In the illustrated embodiment, top of the LED assembly 60 and the second traces 24 are connected to each other via a bond wire 62. Depending on the construction and orientation of LED assembly 60, first traces 22 may provide anode (positive) connections and second traces 24 may comprise cathode (negative) connections for the LED assembly 60 (or vice versa).

The LED assembly 60 can include additional elements. For example, in FIGS. 1B and 2C, the LED assembly 60 is illustrated including the LED bond wire 62, an LED subassembly 64, and a light emitting diode (LED) 66. Such LED subassembly 64 is known in the art and is illustrated for the purposes of discussing the invention and is not meant to be a limitation of the present invention. In the Figures, the LED assembly 60 is shown die-attached to the substrate 20. In alternative embodiments, the mounting pad 28 can be configured to allow flip-chip attachment of the LED assembly 60. Additionally, multiple LED assemblies can be mounted on the mounting pad 28. In alternative embodiments, the LED assembly 60 can be mounted over multiple traces. This is especially true if flip-chip technology is used.

The topology of the traces 22 and 24 can vary widely from the topology illustrated in the Figures while still remaining within the scope of the present invention. In the Figures, three separate cathode (negative) traces 24 are shown to illustrate that three LED assemblies can be placed on the mounting pad 28, each connected to a different cathode (negative) trace; thus, the three LED assemblies may be separately electrically controllable. The traces 22 and 24 are made of conductive material such as gold, silver, tin, or other metals. The traces 22 and 24 can have dimensions as illustrated in the Figures and having thickness in the order of microns or tens of microns depending on application. For example, the traces 22 and 24 can be 15 microns thick. FIGS. 1A and 2A illustrate an orientation marking 27. Such markings can be used to identify the proper orientation of the die package 10 even after assembling the die package 10. The traces 22 and 24, as illustrated, can extend from the mounting pad 28 to sides of the substrate 20.

Continuing to refer to FIGS. 1A through 2D, the substrate 20 defines semi-cylindrical spaces 23 and quarter-cylindrical spaces 25 proximal to its sides. In the Figures, to avoid clutter, only representative spaces 23 and 25 are indicated with reference numbers. The semi-cylindrical spaces 23 and the quarter-cylindrical spaces 25 provide spaces for solder to flow-through and solidify-in when the die package 10 is attached to a printed circuit board (PCB) or another apparatus (not shown) to which the die package 10 is a component thereof. Moreover, the semi-cylindrical spaces 23 and the quarter-cylindrical spaces 25 provide convenient delineation and break points during the manufacturing process.

The substrate 20 can be manufactured as one individual section of a strip having a plurality of adjacent sections, each section being a substrate 20. Alternatively, the substrate 20 can be manufactured as one individual section of an array of sections, the array having multiple rows and columns of adjacent sections. In such configuration, the semi-cylindrical spaces 23 and quarter-cylindrical spaces 25 can be utilized as handles for the strip or the array during the manufacturing process.

Further, the semi-cylindrical spaces 23 and the quarter-cylindrical spaces 25, combined with scribed grooves or other etchings between the sections, assist in separating each individual substrate from the strip or the wafer. The separation can be accomplished by introducing physical stress to the etched lines (crossing the semi-cylindrical spaces 23 and the quarter-cylindrical spaces 25) by bending the strip or the wafer. These features simplify the manufacturing process thus reducing costs by eliminating the need for special carrier fixtures to handle the strip or the wafer during the manufacturing process. Further, the semi-cylindrical spaces 23 and the quarter-cylindrical spaces 25 may serve as via holes connecting the top solder pads 26, the side solder pads 32, and the bottom solder pads 34.

The substrate 20 has a bottom surface 29 including a thermal contact pad 36. The thermal contact pad can be fabricated using material having high heat conductivity such as gold, silver, tin, or other material including but not limited to precious metals.

Figure 3:
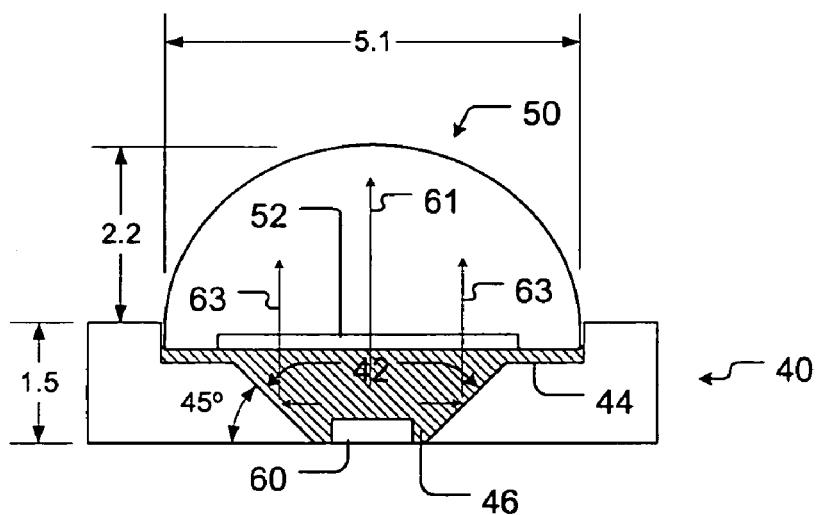
FIG. 3 is a cut-away side view of portions of the semiconductor package of FIG. 1A.

FIG. 3 illustrates a cut-away side view of portions of the semiconductor package of FIGS. 1A and 1B. In particular, the FIG. 3 illustrates a cut-away side view of the top heat sink 40 and the lens 50. Referring to FIGS. 1A, 1B, and 3, the top heat sink 40 is made from material having high thermal conductivity such as aluminum, copper, ceramics, plastics, composites, or a combination of these materials. A high temperature, mechanically tough, dielectric material can be used to overcoat the traces 22 and 24 (with the exception of the central die-attach area) to seal the traces 22 and 24 and provide protection from physical and environmental harm such as scratches and oxidation. The overcoating process can be a part of the substrate manufacturing process. The overcoat, when used, also insulates the substrate 20 from the top heat sink 40. The overcoat may then covered with a high temperature adhesive such as thermal interface material manufactured by THERMOSET that bonds the substrate 20 with the top heat sink 40.

The top heat sink 40 may include a reflective surface 42 substantially surrounding the LED assembly 60 mounted on the mounting pad 28 (of FIGS. 2A and 2C). The reflective surface 42 reflects portions of light from the LED assembly 60 as illustrated by sample light rays 63. Other portions of the light are not reflected by the reflective surface 42 as illustrated by sample light ray 61. Illustrative light rays 61 and 63 are not meant to represent light traces often use in the optical arts. For efficient reflection of the light, the top heat sink 40 is preferably made from material that can be polished, coined, or both. Alternatively, to achieve high reflectivity, the optical reflective surface 42 or the entire heat sink 40 can be plated or deposited with high reflective material such as silver, aluminum, or another substance that serves the purpose. For this reason, the top heat sink 40 is also referred to as a reflector plate 40. The reflector plate 40 is made of material having high thermal conductivity if and when required by the thermal performance of the package 10.

In the illustrated embodiment, the reflective surface 42 is illustrated as a flat surface at an angle, for example 45 degrees, relative to the reflective plate's horizontal plane. The present invention is not limited to the illustrated embodiment. For example, the reflective surface 42 can be at a different angle relative to the reflective plate's horizontal plane. Alternatively, the reflective plate can have a parabolic or another shape.

The reflective plate 40 includes a ledge 44 for supporting and coupling with the lens 50. The LED assembly 60 is encapsulated within the die package 10 (of FIGS. 1A and 1B) using encapsulation material 46 such as, for example only, silicone. The encapsulation material 46 is preferably high temperature polymer with high light transmissivity and refractive index that matches refractive index of the lens 50.

The lens 50 is made from material having high light transmissivity such as, for example only, glass, quartz, high temperature plastic, or a combination of these materials. The lens 50 may be placed in contact with the encapsulation material 46. Consequently, as the die package 10 is heated and experiences thermal expansion, the lens 50 may be cushioned by the encapsulation material 46 such that the lens 50 may be protected from mechanical stresses arising from thermal expansion of other parts of the die package 10. In some embodiments, the lens 50 defines a shallow trough 52 which can be filled with optical chemicals, for example, phosphors, light diffusants such as calcium carbonate, center frequency shifting material such as fluorescent material, or a combination of these materials.

Figure 4:
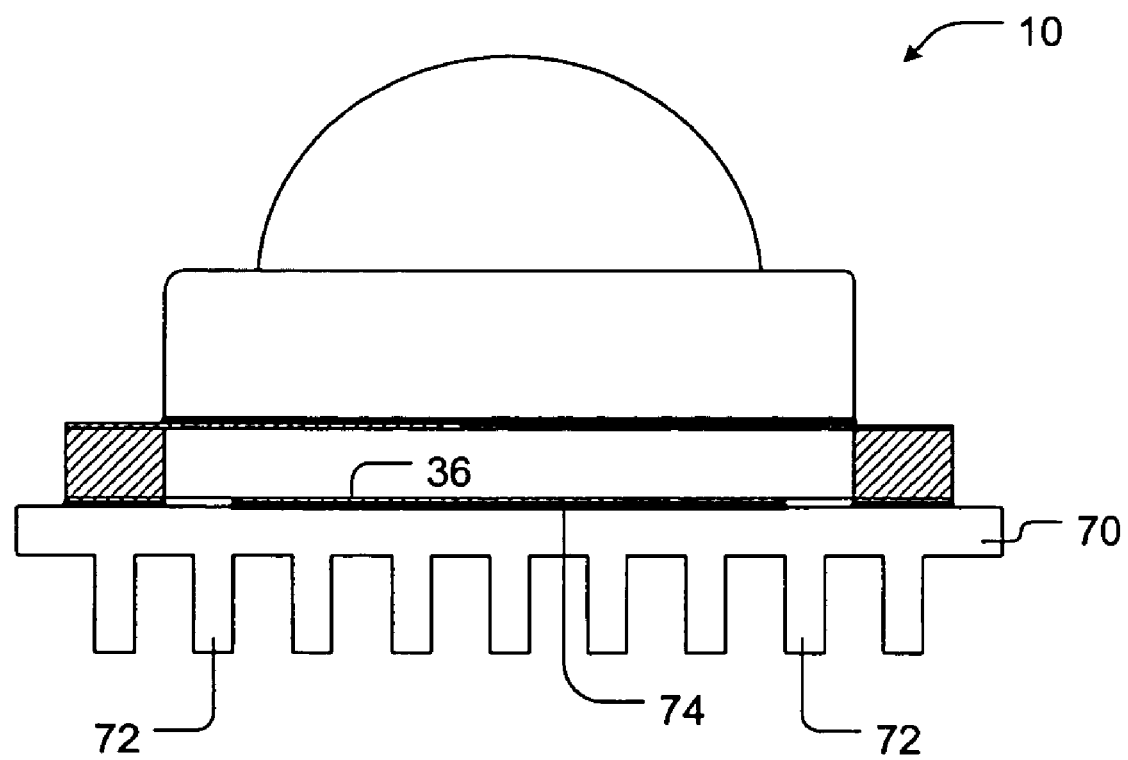
FIG. 4 is a side view of the semiconductor package of FIG. 1A with additional elements.

FIG. 4 illustrates the die package 10 coupled to an external heat sink 70. Referring to FIG. 4, the thermal contact pad 36 can be attached to the external heat sink 70 using epoxy, solder, or any other thermally conductive adhesive, electrically conductive adhesive, or thermally and electrically conductive adhesive 74. The external heat sink 70 can be a printed circuit board (PCB) or other structure that draws heat from the die package 10. The external heat sink can include circuit elements (not shown) or heat dissipation fins 72 in various configurations.

Figure 5:
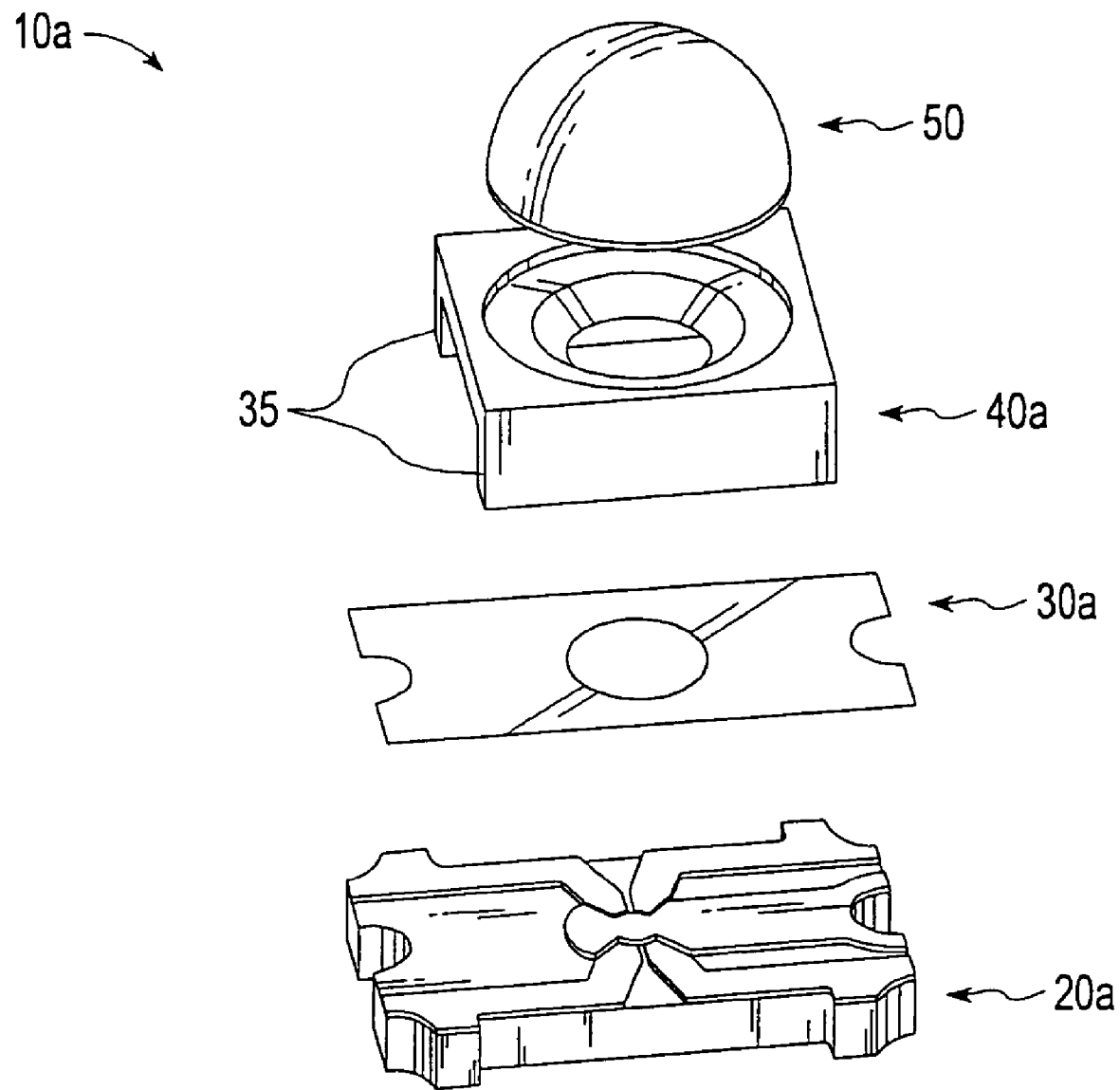
FIG. 5 an exploded perspective view of a semiconductor die package according to another embodiment of the present invention.

An embodiment of the invention having certain alternate configuration is shown in FIGS. 5 through 6D. Portions of this second embodiment are similar to corresponding portions of the first embodiment illustrated in FIGS. 1A through 4. For convenience, portions of the second embodiment as illustrated in FIGS. 5 through 6D that are similar to portions of the first embodiment are assigned the same reference numerals, analogous but changed portions are assigned the same reference numerals accompanied by letter "a," and different portions are assigned different reference numerals.

FIG. 5 is an exploded perspective view of an LED die package 10a in accordance with other embodiments of the present invention. Referring to FIG. 5, the light emitting die package 10a of the present invention includes a bottom heat sink (substrate) 20a, a top heat sink (reflector plate) 40a, and a lens 50. An insulating layer 30a of insulating materials may be used to insulate the reflector plate 40a from the bottom heat sink 20a.

FIGS. 6A, 6B, 6C, and 6D, provide, respectively, a top view, a side view a front view, and a bottom view of the substrate 20a of FIG. 5. Referring to FIGS. 5 through 6D, in the illustrated embodiment, the substrate 20a includes one positive trace 22a and four negative traces 24a. These traces 22a and 24a have are configured differently than the traces 22 and 24 of FIG. 2A. The substrate 20a includes flanges 31 that define latch spaces 33 for reception of legs 35 of the reflector plate 40a thereby mechanically engaging the reflector plate 40a with the substrate 20a.

Other embodiments of the invention are illustrated in FIGS. 7A through 10B. According to these embodiments, a substrate for a high power light emitting device includes a thermally and electrically conductive plate having first and second surfaces. The plate may comprise a metal such as copper, aluminum or alloys of either. A thin, thermally conductive insulating film is formed on the first surface of the metal plate. In some embodiments, the thermally conductive insulating film comprises a ceramic/polymer film such as the Thermal Clad film available from by The Bergquist Company of Chanhassen, Minn., USA.

Conductive elements such as metal traces and/or metal leads may be formed on the ceramic/polymer film. Since the ceramic/polymer film is insulating, the conductive traces are not in electrical contact with the metal plate. A conductive element may form or be electrically connected to a mounting pad adapted to receive an electronic device. As discussed above in connection with the embodiments illustrated in FIGS. 1–6, the topology of the metal traces may vary widely while still remaining within the scope of the invention.

An LED assembly may be bonded to the mounting pad for example by means of soldering, thermosonic bonding or thermocompression bonding. Heat generated by the LED may be dissipated at least in part through the metal plate. Since the substrate itself may act as a heatsink, the need for bonding an additional heatsink to the structure may be reduced or eliminated. However, an additional heatsink may be placed in thermal communication with the metal plate so that heat may be drawn away from the operating device more efficiently.

In one embodiment, one or more via holes may be formed through the insulating film and the metal plate. The via holes may be internally coated with an insulating material such as the ceramic/polymer film. Electrical conductors such as electrically conductive traces may be formed in the via and may electrically connect conductive elements on the first surface of the substrate to conductive elements on the second surface of the substrate. A substrate according to such an embodiment may be mounted on a surface such as a printed circuit board without the use of metal leads, which may result in a more mechanically robust package.

A substrate according to embodiments of the present invention may also include electronic circuitry such as a discrete zener diode and/or a resistor network for electrostatic discharge (ESD) and/or over-voltage protection.

Although not illustrated in FIGS. 7–10, the substrate may further include features such as the semi-cylindrical and quarter-cylindrical spaces, orientation markings, side bond pads, flanges and other features illustrated in FIGS. 1–6.

Portions of the embodiments illustrated in FIGS. 7A through 10B are similar to corresponding portions of the embodiments illustrated in FIGS. 1 through 6D. For convenience, portions of the embodiment as illustrated in FIGS. 7A through 10B that are similar to portions of the first embodiment are assigned the same reference numerals, analogous but changed portions are assigned the same reference numerals accompanied by letter "b," and different portions are assigned different reference numerals.

Figure 7A:
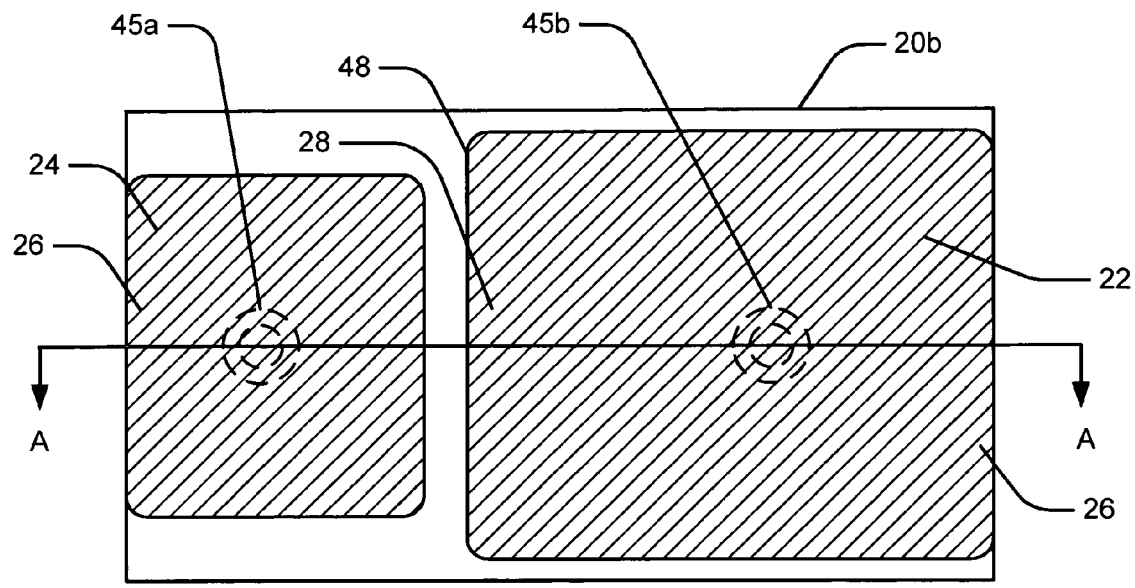
FIG. 7A is a top view of a portion of a semiconductor package according to another embodiments of the present invention.

Referring now to FIG. 7A, a substrate 20b according to another embodiments of the present invention is illustrated.

Figure 7B:
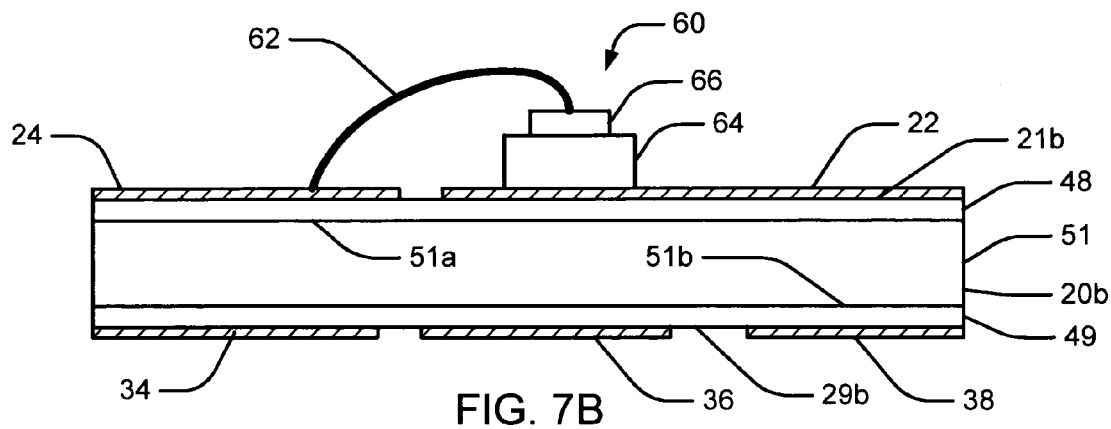
FIG. 7B is a front view of the portion of a semiconductor package of FIG. 7A.

FIGS. 7A and 7B provide, respectively, a top view and a front view of the substrate 20b. Further, FIG. 7B also shows an LED assembly 60 in addition to the front view of the substrate 20b. The substrate 20b includes a thermally and electrically conductive plate 51 having first and second surfaces 51a and 51b. The plate 51 may comprise a metal such as copper, aluminum or alloys of either. A thin, thermally conductive insulating film 48 is formed on at least portions of the first surface 51a of the metal plate 51. In some embodiments, the thermally conductive insulating film 48 comprises a ceramic/polymer film such as the Thermal Clad film available from by The Bergquist Company of Chanhassen, Minn., USA. In addition, a thermally conductive insulating film 49 may be formed on the second surface 51b of plate 51, as well as side surfaces.

The substrate 20b provides support for electrically conductive elements such as electrical traces 22 and 24; for solder pads 26 ; and for the LED assembly 60. Further, additional traces and connections can be fabricated on the top, side, or bottom of the substrate 20b, or layered within the substrate 20b. The traces 22 and 24, the solder pads 26, and any other connections can be interconnected to each other in any combinations using known methods, for example via holes.

The substrate 20b has a top surface 21b, the top surface 21b including the electrical traces 22 and 24. The traces 22 and 24 provide electrical connections from the solder pads (for example top solder pads 26) to a mounting pad 28. The top solder pads 26 may comprise portions of the traces 22 and 24 generally proximal to sides of the substrate 20b. The mounting pad 28 is a portion of the top surface (including portions of the trace 22, the trace 24, or both) where the LED assembly 60 is mounted. Typically the mounting pad 28 is generally located proximal to center of the top surface 21b. In alternative embodiments of the present invention, the LED assembly 60 can be replaced by other semiconductor circuits or chips.

The topology of the traces 22 and 24 can vary widely from the topology illustrated in the Figures while still remaining within the scope of the present invention. In the Figures, only one cathode (negative) and one anode (positive) trace is shown. However, multiple cathode or anode traces may be included on the substrate 20b to facilitate the mounting of plural LED assemblies on the mounting pad 28, each connected to a different cathode or anode trace; thus, the three LED assemblies may be separately electrically controllable. The traces 22 and 24 are made of conductive material such as gold, silver, tin, or other metals.

The substrate 20b has a bottom surface 29b including a thermal contact pad 36. The thermal contact pad can be fabricated using material having high heat conductivity such as gold, silver, tin, or other material including but not limited to precious metals.

Figure 7C:
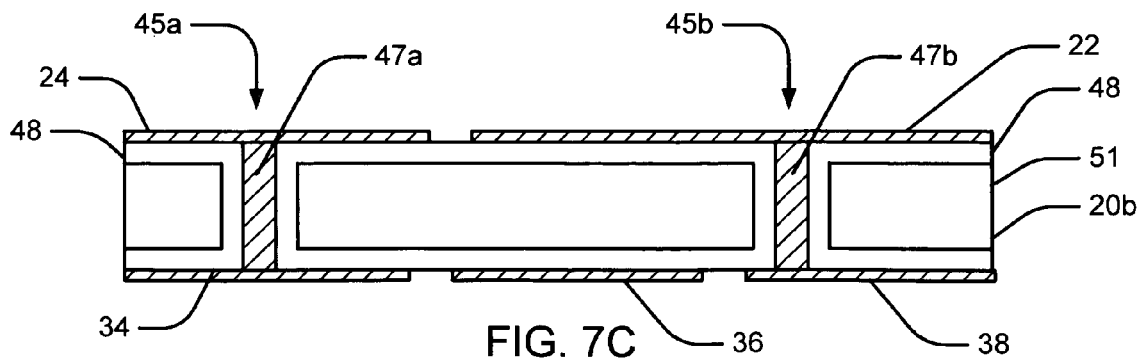
FIG. 7C is a cut-away front view of the portion of a semiconductor package of FIG. 7A taken along line A—A.

FIG. 7C illustrates a cut-away front view of portions of the substrate 20b taken along section line A—A of FIG. 7A. As shown in FIG. 7C, one or more via holes 45a, 45b may be formed through the substrate 20b. The via holes 45a, 45b may be internally coated with an insulating material such as the ceramic/polymer film. Electrical conductors such as electrically conductive traces 47a, 47b may be formed in the via holes and may electrically connect conductive elements on the first surface of the substrate to conductive elements on the second surface of the substrate. As illustrated in FIG. 7C, a conductive trace 47a in via hole 45a connects trace 24 on the first side 21b, or the top surface 21b, of the substrate 20b to solder pad 34 on the second side 29b, or the bottom surface 29b, of the substrate 20b. Likewise, a conductive trace 47b extending through via hole 45b connects conductive trace 22 to a bond pad 38.

A substrate according to such an embodiment may be mounted on a surface such as a printed circuit board without the use of metal leads, which may result in a more mechanically robust package.

As discussed above, a high temperature, mechanically tough, dielectric material can be used to overcoat the traces 22 and 24 (with the exception of the central die-attach area 28) to seal the traces 22 and 24 and provide protection from physical and environmental harm such as scratches and oxidation. The overcoating process can be a part of the substrate manufacturing process. The overcoat, when used, also insulates the traces 22 and 24 from the top heat sink 40. The overcoat may then be covered with a high temperature adhesive such as thermal interface material manufactured by THERMOSET that bonds the substrate 20b with the top heat sink 40.

Figure 8:
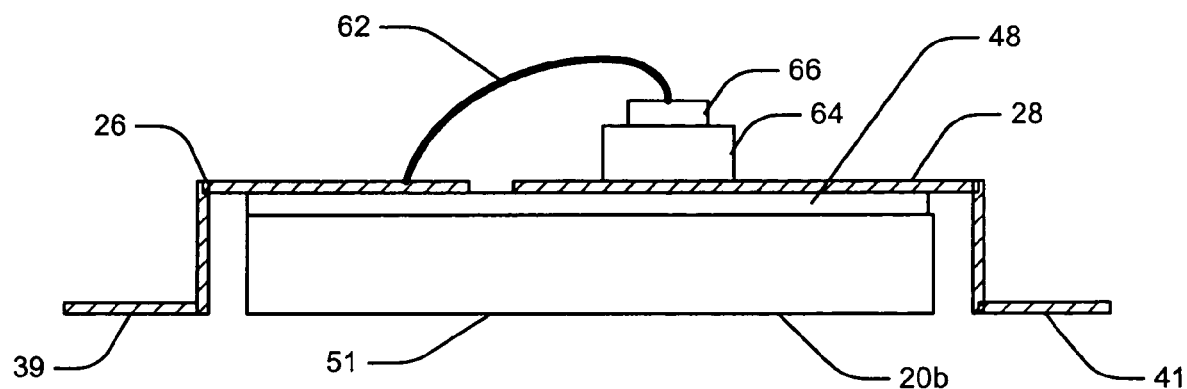
FIG. 8 is a side view of a portion of a semiconductor package according to another embodiment of the present invention.
Figure 9:
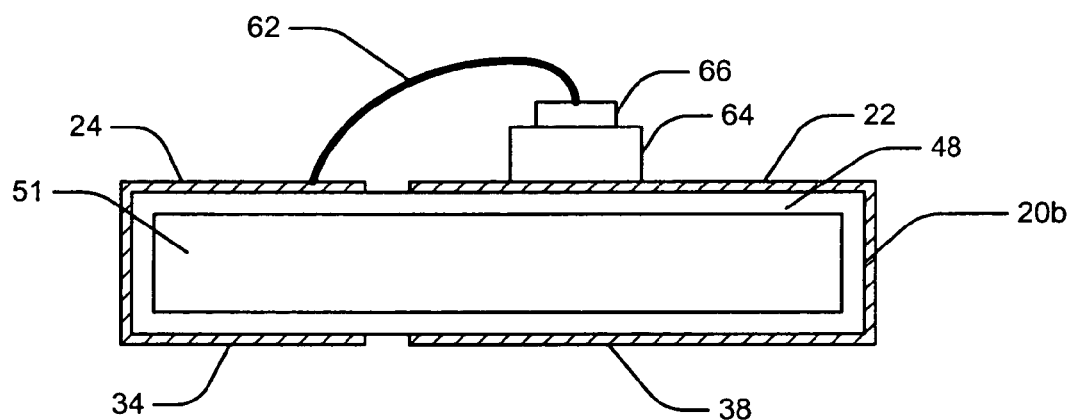
FIG. 9 is a side view of a portion of a semiconductor package according to another embodiment of the present invention.

Other embodiments that do not utilize via holes are illustrated in FIGS. 8 and 9. As illustrated in FIG. 8, the conductive traces 22, 24 may form or be attached to metal leads 39, 41 which extend away from the package and which may be mounted directly to a circuit board. In such an embodiment, only the first surface 21b of the substrate 20b may include an electrically insulating, thermally conductive film 48.

FIG. 9 illustrates an embodiment in which conductive traces 22, 24 extend down the sidewalls of the substrate 20b to contact bond pads 34 and 38 on the second surface of the substrate 20b. Such a configuration may permit the package to be mounted directly onto a circuit board without the use of metal leads or via holes.

Figure 10A:
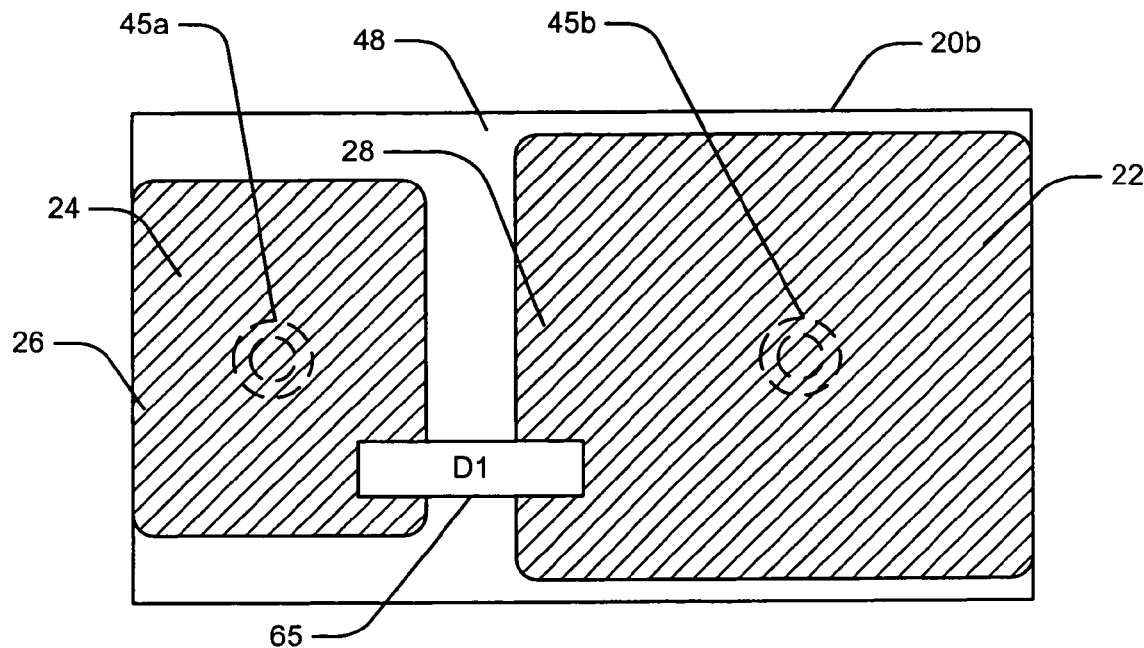
FIG. 10A is a top view of a portion of a semiconductor package according to another embodiments of the present invention.
Figure 10B:
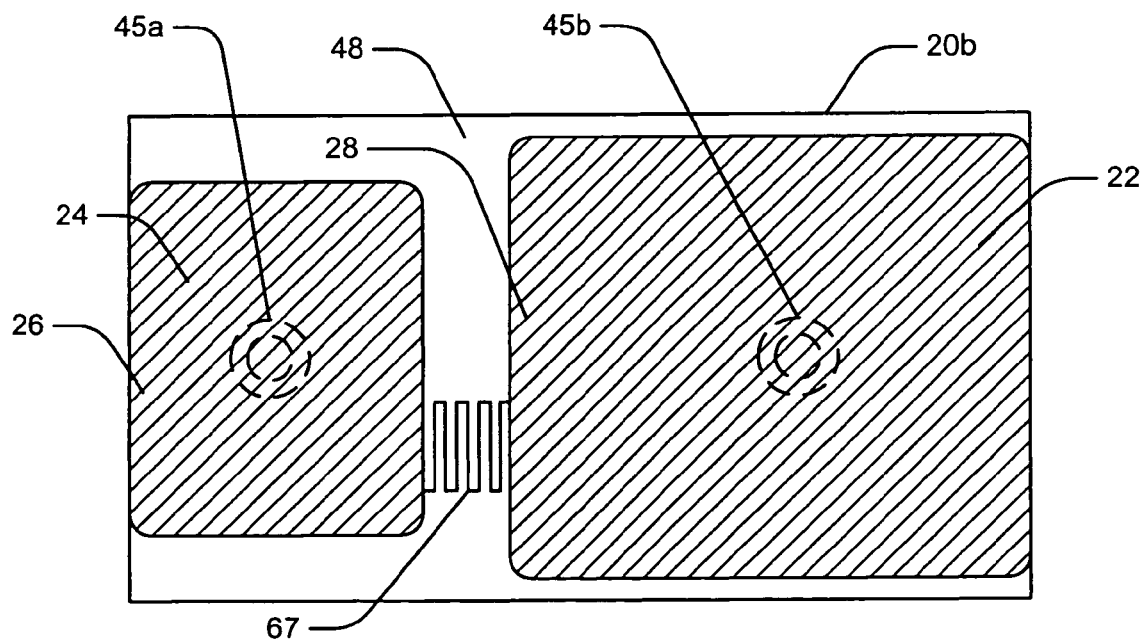
FIG. 10B is a top view of a portion of a semiconductor package according to anther embodiments of the present invention.

As illustrated in FIGS. 10A and 10B, the substrate 20b may be configured to include electronic circuitry such as a discrete zener 65 diode, a resistor network 67, other electronic elements, or any combination of these. Such electronic circuitry can be connected between the traces 22 and 24 which may operate as anode/or cathode elements. The electronic circuitry can be used for various purposes, for example, to prevent electro-static discharge (ESD), for overvoltage protection, or both. In the illustrated examples, the zener diode D1 65 connected between the trace 22 and the trace 24 as illustrated in FIG. 10B may prevent an excessive reverse voltage from being applied to an optoelectronic device mounted on the substrate 20b. Similarly, the resistor network 67 such as printed resistor 67 may provide ESD protection to a device mounted on the substrate 20.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow. In the following, claims drafted to take advantage of the "means or steps for" provision of 35 USC section 112 are identified by the phrase "means for."

What is claimed is:

1. A light emitting die package comprising:
   a substrate comprising an electrically and thermally conductive material and having a first surface;
   a thermally conductive, electrically insulating film covering at least a portion of said first surface;
   a first conductive element on said insulating film, said conductive element insulated from said substrate by said insulating film;

a second conductive element on said insulating film, said second conductive element spaced apart from said first conductive element and electrically insulated from said substrate by said insulating film wherein at least one of said first and second conductive elements comprises a mounting pad for mounting a light emitting die thereon;

a reflector plate coupled to said substrate and substantially surrounding the mounting pad, said reflector plate defining a reflection surface; and a lens substantially covering the mounting pad.

2. The light emitting die package recited in claim 1 further comprising a light emitting diode (LED) mounted on said substrate and connected to the first and second conductive elements.

3. The light emitting die package recited in claim 2 wherein the LED is encapsulated within optically clear polymer.

4. The light emitting die package recited in claim 1 wherein said first and second conductive elements comprise metal traces.

5. The light emitting die package recited in claim 1 wherein said substrate comprises a metal.

6. The light emitting die package recited in claim 5, wherein said substrate comprises a metal selected from the group consisting of copper and aluminum.

7. The light emitting die package recited in claim 5, wherein said substrate comprises a copper/aluminum alloy.

8. The light emitting die package recited in claim 1 wherein said insulating film comprises a ceramic polymer film.

9. The light emitting die package recited in claim 1, wherein said substrate comprises a second surface opposite said first surface, and further comprising at least one via hole through said substrate.

10. The light emitting die package recited in claim 9, wherein the surface of said via hole is coated with an insulating film coating.

11. The light emitting die package recited in claim 9 wherein said second surface of said substrate includes a thermally conductive insulating film on at least a portion of said second surface and wherein said package further comprises a third electrical lead on said second surface, said third electrical lead is insulated from said substrate by said thermally conductive insulating film and said third electrical lead is in electrical contact with said conductive trace through said via hole.

12. The light emitting die package recited in claim 1 further comprising an external heat sink coupled to said substrate.

13. The light emitting die package recited in claim 12 wherein said substrate has a bottom side plated with metals for coupling with said external heat sink.

14. The light emitting die package recited in claim 1 wherein at least one conductive element extends from the mounting pad to a side of said substrate.

15. The light emitting die package recited in claim 1 wherein said substrate comprises flanges along at least one side for mechanically engaging said reflector plate.

16. The light emitting die package recited in claim 1 wherein said reflector plate substantially surrounds the mounting pad.

17. The light emitting die package recited in claim 1 wherein said reflector plate comprises material having high thermal conductivity.

18. The light emitting die package recited in claim 1 wherein said reflector plate comprises at least one leg mechanically engaging said substrate for increased thermal transfer.

19. The light emitting die package recited in claim 1 wherein said lens comprises a trough adapted to receive optical chemicals.

20. The light emitting die package recited in claim 1 wherein said lens comprises frequency shifting compounds.

21. The light emitting die package recited in claim 1 wherein said lens comprises diffusant.

22. The light emitting die package recited in claim 1 wherein said lens comprises a phosphor.

23. A light emitting die package comprising:

a metal substrate having a first surface;

an electrically insulating film covering at least a portion of said first surface;

a first conductive trace on said insulating film, said conductive trace insulated from said substrate by said insulating film;

a mounting pad for mounting a light emitting device, said mounting pad electrically connected to said first conductive trace;

a reflector plate coupled to said substrate and substantially surrounding the mounting pad, said reflector plate defining a reflection surface; and a lens substantially covering the mounting pad.

* * * * *